US011487915B2

(12) United States Patent
Eliseeva et al.

(10) Patent No.: US 11,487,915 B2
(45) Date of Patent: Nov. 1, 2022

(54) INTEGRATED MODELING USING MULTIPLE SUBSURFACE MODELS

(71) Applicant: ONESUBSEA IP UK LIMITED, London (GB)

(72) Inventors: Ekaterina Eliseeva, Houston, TX (US); Elena Valova, Houston, TX (US); Vijaya Bhatta Halabe, Katy, TX (US); Sarah Rae Kunz, Sugar Land, TX (US); Robert Edward Sauve, Katy, TX (US)

(73) Assignee: OneSubsea IP UK Limited, London (GB)

( * ) Notice: Subject to any disclaimer, the term of this patent is extended or adjusted under 35 U.S.C. 154(b) by 1316 days.

(21) Appl. No.: 15/195,816

(22) Filed: Jun. 28, 2016

(65) Prior Publication Data
US 2017/0371984 A1    Dec. 28, 2017

Related U.S. Application Data

(60) Provisional application No. 62/186,232, filed on Jun. 29, 2015.

(51) Int. Cl.
*G06G 7/48* (2006.01)
*G06F 30/20* (2020.01)
*E21B 43/00* (2006.01)

(52) U.S. Cl.
CPC .............. *G06F 30/20* (2020.01); *E21B 43/00* (2013.01)

(58) Field of Classification Search
CPC ........... G06F 30/20; G06F 43/00; G01V 3/38; G01V 3/32; G01V 99/005; G01V 1/306;
(Continued)

(56) References Cited

U.S. PATENT DOCUMENTS 8,195,401 B2 * 6/2012 Ella .................. G06Q 10/06
702/13
9,228,415 B2 * 1/2016 Ingham ............... E21B 41/00
(Continued)

FOREIGN PATENT DOCUMENTS

EP    2431767 A2    3/2012
GB    2472683 A     2/2011
(Continued)

OTHER PUBLICATIONS

PCT International Search Report and Written Opinion; Application No. PCT/IB2016/053909; dated Oct. 18, 2016 16 pages.
(Continued)

*Primary Examiner* — Rehana Perveen
*Assistant Examiner* — Cuong V Luu
(74) *Attorney, Agent, or Firm* — Eileen Pape

(57) ABSTRACT

A method of integrated modeling using multiple subsurface models includes receiving multiple sets of input values associated with a hydrocarbon formation of the Earth. The method also includes receiving a network model that includes one or more assets configured to distribute a flow of hydrocarbons from the hydrocarbon formation to a processing facility. The method further includes generating the multiple subsurface models based on the multiple sets of input values, wherein each subsurface model comprises a set of input values of the multiple sets of input values, and wherein each subsurface model represents a production of the flow of hydrocarbons from the hydrocarbon formation. The method also includes applying the multiple subsurface models to the network model to generate an integrated model comprising multiple production rates of hydrocarbons via the one or more assets over time. The method further includes identifying at least one asset to adjust based on the integrated model.

18 Claims, 6 Drawing Sheets

(58) Field of Classification Search
CPC .. G01V 3/12; G01V 2210/66; G01V 2200/16; G01V 1/345; G01V 5/107; G01V 1/28
See application file for complete search history.

(56) References Cited

U.S. PATENT DOCUMENTS

| | | | |
|---|---|---|---|
| 2002/0120429 A1* | 8/2002 | Ortoleva | E21B 41/0064 703/2 |
| 2004/0220790 A1* | 11/2004 | Cullick | G06Q 10/06 703/10 |
| 2007/0112547 A1* | 5/2007 | Ghorayeb | E21B 41/00 703/10 |
| 2008/0133194 A1* | 6/2008 | Klumpen | E21B 47/00 703/10 |
| 2008/0234939 A1* | 9/2008 | Foot | E21B 43/00 702/12 |
| 2009/0182541 A1* | 7/2009 | Crick | E21B 43/00 703/10 |
| 2009/0314490 A1* | 12/2009 | Prange | E21B 47/00 166/250.09 |
| 2011/0024125 A1* | 2/2011 | Wallace | G01V 99/00 166/369 |
| 2011/0040533 A1* | 2/2011 | Torrens | E21B 44/00 703/2 |
| 2011/0060572 A1* | 3/2011 | Brown | E21B 43/00 703/10 |
| 2011/0119040 A1* | 5/2011 | McLennan | G06F 17/18 703/2 |
| 2012/0253770 A1* | 10/2012 | Stern | G01V 11/00 703/10 |
| 2013/0140031 A1* | 6/2013 | Cohen | E21B 43/26 166/308.1 |
| 2014/0365409 A1* | 12/2014 | Burch | E21B 41/0092 706/12 |
| 2016/0154907 A1* | 6/2016 | Halabe | G06F 17/5009 703/7 |
| 2016/0356125 A1* | 12/2016 | Bello | G06Q 10/04 |
| 2017/0177761 A1* | 6/2017 | Early | E21B 41/0092 |
| 2017/0247995 A1* | 8/2017 | Crews | E21B 41/0035 |
| 2017/0337302 A1* | 11/2017 | Mezghani | G06F 17/5009 |

FOREIGN PATENT DOCUMENTS

| | | |
|---|---|---|
| WO | 2004/049216 A1 | 6/2004 |
| WO | 2016/089839 A1 | 6/2016 |

OTHER PUBLICATIONS

Barber et al.; "Optimizing Production from Reservoir to Process Plant"; Oilfield Review; May 5, 2008; pp. 18-29.

* cited by examiner

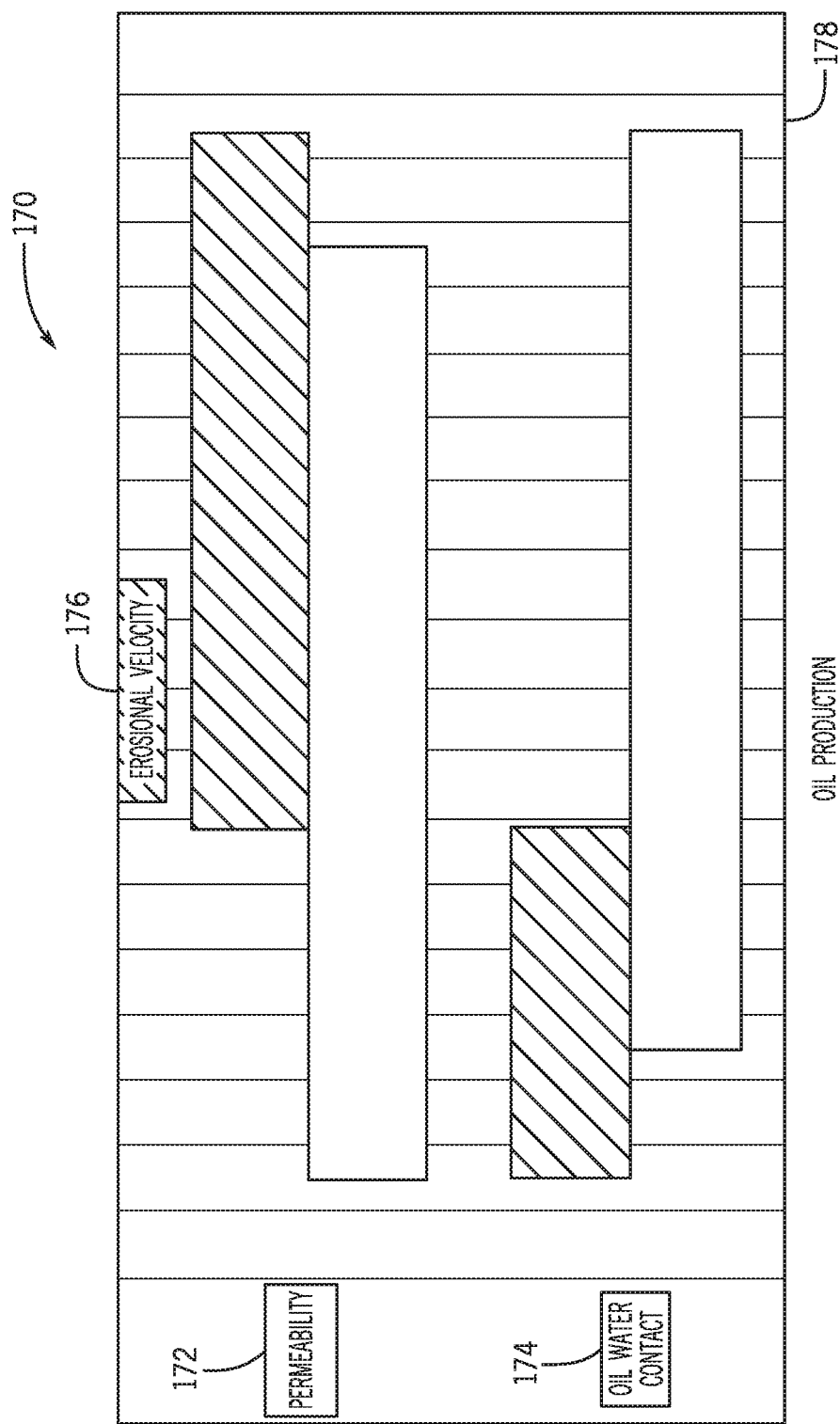

INTEGRATED MODELING USING MULTIPLE SUBSURFACE MODELS

CROSS-REFERENCE TO RELATED APPLICATIONS

This application claims priority to and benefit from U.S. Provisional Application No. 62/186,232 filed Jun. 29, 2015, and incorporates the entirety of the same by reference herein.

BACKGROUND

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

The present disclosure relates generally to integrated modeling. More particularly, the present disclosure relates to integrated modeling using multiple subsurface models coupled to one or more gathering network models.

For example, integrated models may be used in the oil and gas industry to simulate a production system based on various parameters, from reservoir-based rock formation and fluid flow parameters to well and pipeline equipment-based production parameters, for the purpose of prospective system planning. In operation, an integrated model may couple a subsurface model with a network model. The network model may model a single well, a network of wells, a production facility, production equipment, or any combination thereof, that transfers hydrocarbon production extracted from the hydrocarbon formation to processing facilities. However, existing integrated modeling software may simulate just one subsurface model at a time. Because each subsurface model corresponds to a single set of input parameters, simulating ranges of the input parameters includes performing multiple evaluations of the subsurface model corresponding to each permutation of input parameters, which may be an inefficient use of computing resources.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to methods for enhancing workflows in the oil and gas exploration and production industry. The methods of the present disclosure offer improved solutions to complex field development planning via construction of an integrated model that couples multiple subsurface models with network models and investigation of how a range of subsurface parameters and uncertainties impact field design, risk, and cost. The methods of the present disclosure enable stepping through multiple subsurface models using various input parameters, including uncertainty parameters. The methods of the present disclosure also include coupling the multiple subsurface models with one or more network models to account for uncertainties within production and distribution assets and to improve design of a production system based on the coupled models.

Various refinements of the features noted above may be made in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various features, aspects, and advantages of the present disclosure will become better understood when the following detailed description is read with reference to the accompanying figures in which like characters represent like parts throughout the figures, wherein:

FIG. 8 is an example tornado plot of an effect of permeability and oil-water contact on EVR and total oil production based on an integrated model, in accordance with an embodiment of the present disclosure.

DETAILED DESCRIPTION

Figure 1:
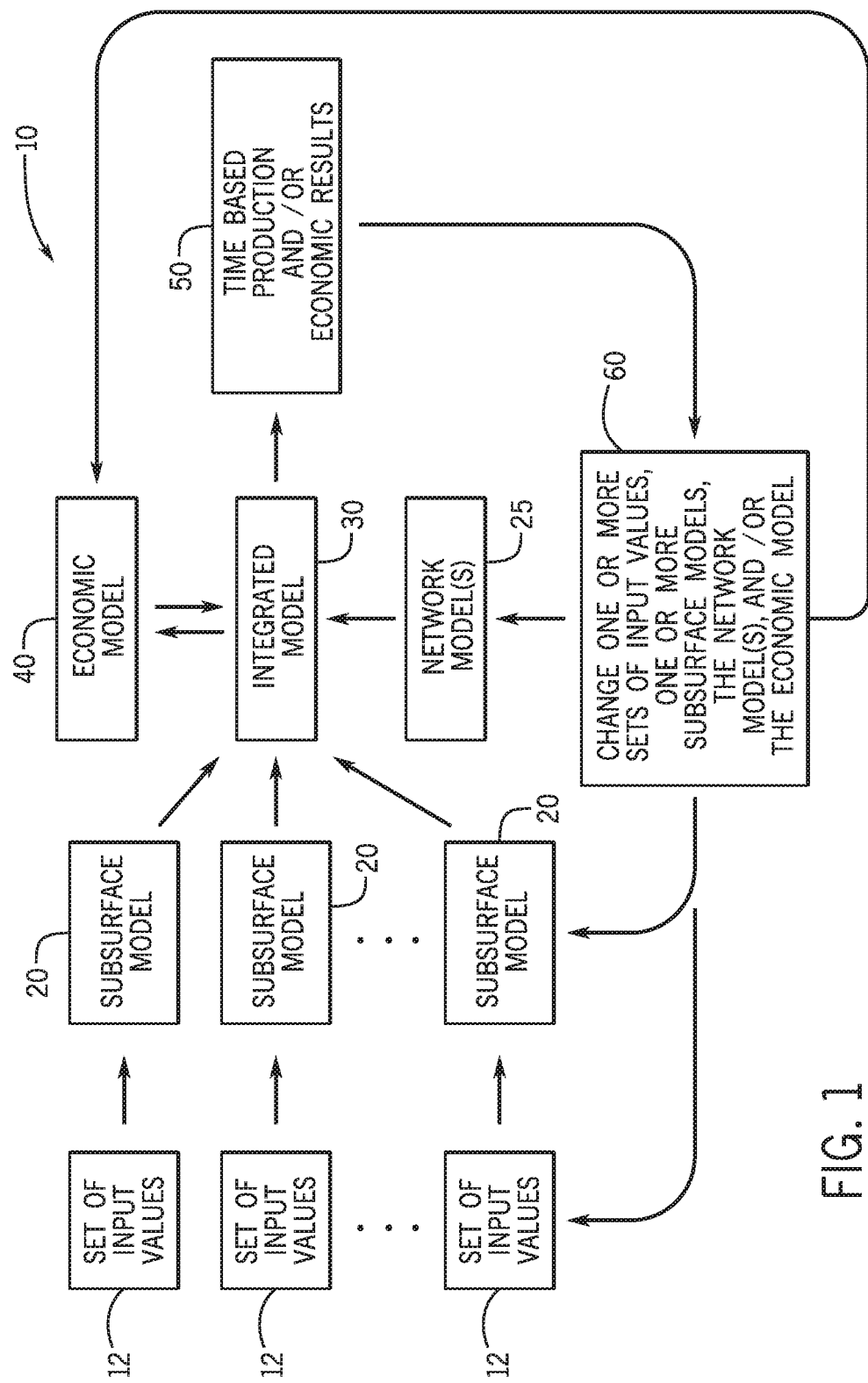
FIG. 1 is a block diagram of a workflow for applying multiple subsurface models of a hydrocarbon formation to one or more network models to generate an integrated model, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The drawing figures are not necessarily to scale. Certain features of the embodiments may be shown exaggerated in scale or in somewhat schematic form, and some details of conventional elements may not be shown in the interest of clarity and conciseness. Although one or more embodiments may be preferred, the embodiments disclosed should not be interpreted, or otherwise used, as limiting the scope of the disclosure, including the claims. It is to be fully recognized that the different teachings of the embodiments discussed may be employed separately or in any suitable combination to produce desired results. In addition, one skilled in the art will understand that the description has broad application, and the discussion of any embodiment is meant only to be exemplary of that embodiment, and not intended to intimate that the scope of the disclosure, including the claims, is limited to that embodiment.

When introducing elements of various embodiments of the present disclosure, the articles "a," "an," and "the" are intended to mean that there are one or more of the elements. The terms "comprising," "including," and "having" are used in an open-ended fashion, and thus should be interpreted to mean "including, but not limited to . . . ." Any use of any form of the terms "connect," "couple," or any other term describing an interaction between elements is intended to mean either an indirect or a direct interaction between the elements described.

Certain terms are used throughout the description and claims to refer to particular features or components. As one skilled in the art will appreciate, different persons may refer to the same feature or component by different names. This document does not intend to distinguish between components or features that differ in name but not function, unless specifically stated.

Embodiments of the present disclosure relate generally to methods for improving, enhancing, and/or extending workflows used in the oil and gas industry by applying multiple subsurface models to one or more network models, such that the methods may iterate through multiple subsurface models. By including multiple subsurface models, the disclosed methods facilitate constructing and designing production equipment, simulating responses of different production systems, including artificial lift systems, to different input parameter values, and capturing potential production and economic risk due to subsurface uncertainties. In some embodiments, the presently disclosed systems and methods may enable a production system to improve the efficiency (e.g., in producing hydrocarbons) based on an integrated subsurface model that applies multiple subsurface models to one or more network models. That is, for instance, certain production assets (e.g., pumps, valves, and other suitable production equipment) may be adjusted during operation of the production system based on the integrated subsurface model. As a result, the presently disclosed systems and techniques improve the operation of the production system.

Moreover, by using an integrated subsurface model, the presently disclosed systems and methods may also be used to identify various production and network assets that may be used to efficiently extract hydrocarbons from one or more wells over the lifetime a field that includes the wells. Additional details with regard to generating and using the integrated subsurface model to improve the design and operation of a production system will be discussed below with reference to FIGS. 1-8.

By way of introduction, FIG. 1 is a block diagram of a workflow 10 for applying multiple subsurface models 20 of a hydrocarbon formation to one or more network models 25, in accordance with an embodiment of the present disclosure. Generating a subsurface model 20 of the hydrocarbon formation for oil and gas exploration and production purposes includes accounting for unknown input values, which correspond to input parameters for characteristics of the hydrocarbon formation. These input parameters may include any information useful for simulating the hydrocarbon formation, including those that are well-known in the oil and gas exploration and production industry. For example, the input parameters may include, without limitation, gas content, oil content, water content, size of an aquifer, strength of an aquifer, permeability, porosity, oil-water contacts, gas-oil contacts, facies heterogeneity, transmissivity at faults, and the like.

Because the actual values of the input parameters are unknown and may be difficult and not cost-effective to measure, assumptions may be made for these values by estimating viable ranges. For example, a permeability for the subsurface model may be expressed in a range or distribution of permeability input values. The range of input values may be determined based on any combination of information gathered at the hydrocarbon formation, data provided by a study performed on the hydrocarbon formation, extrapolation of the data, and the like. For example, the range of permeability input values may be determined based on information gathered by a wireline tool equipped with sensing, logging, or other equipment at the hydrocarbon formation. Referring again to FIG. 1, for each unique set or permutation of input values, a corresponding set 12 of input values may be generated based on reservoir simulation software such as, for example and without limitation, Schlumberger ECLIPSE. Because there may be a number of input parameters, the resulting number of sets 12 of input values may be extensive.

For each set 12 of input values, a subsurface model 20 is received or generated. The subsurface model 20 represents various properties of a hydrocarbon formation of the Earth, including a location of subsurface reservoir of hydrocarbons, locations of various geological formations, locations of various rock layers, locations of various types of deposits, locations of water contact, and the like. In some embodiments, a subsurface model 20 output may be generated over time using predictive computer modeling of subsurface behavior i.e. numerical simulation computer software. In other words, in embodiments, the subsurface model 20 output may include a forecast of oil, gas, and/or water production as a function of time. Any number of subsurface models 20 outputs may be generated, subject only to practical considerations such as hardware or processing capability/availability and the like. Multiple subsurface models 20 outputs may be generated sequentially or in parallel, where parallel processing may be particularly applicable in workflows having larger total numbers of subsurface models 20. Generating the subsurface model 20 outputs may be based on reservoir simulation software such as, for example and without limitation, Schlumberger ECLIPSE. Uncertainty and/or optimization simulation scenarios may be integrated using, for example, the Schlumberger Petrel software platform.

As illustrated, a network model 25 or outputs of the network model 25, which may use steady state and/or dynamic flow modeling, is received or generated based on various assets (e.g., type of artificial lift, pipeline sizing, insulation, injection assets, and pumps) that may be used to extract the hydrocarbons and any associated fluids or other matter from the hydrocarbon formation of the Earth and transport the extracted hydrocarbons to the surface. As such, the network model 25 represents a system that delivers production from the hydrocarbon formation to one or more processing facilities. The network model 25 may model a single well, a network of wells, a production facility, production equipment, or any combination thereof, that transfers hydrocarbon production extracted from the hydrocarbon formation to the one or more processing facilities. The network model 25 may include input parameters for a number of wells, a size of the well(s) (e.g., overall or producing length, internal or outer diameter, and the like), relevant distances (e.g. between wells and/or other equipment, such as pumps or other boosting equipment, the surface, and the like), information related to artificial lift (e.g., a process used on a well to overcome back pressure on the reservoir to encourage transfer of fluid, which may include liquid and gas, to the surface), pipeline sizing information, information related to production routing (e.g., a process used to divert well production to reduce back pressures within a network), information related to commingling production from multiple wells, information related to an injection system, and the like. In some embodiments, a network model 25 may be selected based on any combination of existing assets, well and/or asset availability, scheduling preferences, and the like. The network model 25 may include a variety of equipment selected (e.g., by a user, simulator, software, and the like) based on estimated characteristics of the hydrocarbon formation. For example, the equipment may be selected to operate under a desired pressure that is estimated based on data associated with the hydrocarbon formation. The network model 25 may be provided using software such as, for example and without limitation, Schlumberger PIPESIM or Petroleum Experts GAP. In some embodiments, multiple network models 25 may be used if, for example, it is desirable to evaluate a variety of network configurations.

According to embodiments of the present disclosure, the multiple subsurface models 20 are generated based on the different sets 12 of input values may be applied to the network model 25 to generate an integrated model 30. That is, for each subsurface model 20 generated based on each set 12 of input values, the production of hydrocarbons from the hydrocarbon formation through the network model 25 may be determined for the life of the field based on a respective subsurface model 20. As such, the integrated model 30 may use the expected behavior of the hydrocarbons being extracted from the hydrocarbon formation according to the subsurface model 20 to determine how the extracted hydrocarbons may be distributed via the network routing according to the network model 25.

Subsurface multiple reservoir models may be created as scenarios of one base reservoir model, where each of the multiple reservoir models may have different sets of input variables, boundary conditions, and/or initial conditions using the same grid, field, or hydrocarbon formation. In some embodiments, the grid may include a matrix of grid blocks (or other discretized shapes) applied in simulation based on hydrocarbon formation data/reservoir characteristics to manipulate a numerical solution during processing. The reservoir base model may couple to the network model 25 by mapping reservoir completions to the network wells in the integrated modeling framework to exchange boundary conditions. Production controls/field development strategies may be defined in an integrated model 30 of the present disclosure, as illustrated in FIG. 1, to manage a full field model. Applying multiple realization tools to an integrated asset mode 30 may replace a base model subsurface with each realization of the reservoir model, creating a new scenario of the full field model that applies the same set of connection settings and production controls. Output results may be stored for each realization for further analysis. In some embodiments of the present disclosure, the integrated model may be generated at least in part using commercially available simulation software such as for example the Schlumberger Integrated Asset Model (IAM) software, the Petroleum Experts' Integrated Production Modeling (IPM) software, or any other suitable integrated modeling software.

Still referring to FIG. 1, in some embodiments, the integrated model 30 may provide selections for the various input values represented by the multiple sets 12 of input values, and corresponding economic costs and level of associated risk when a set 12 of input values is selected. The risk may include any suitable risk associated with subsurface development and production, such as any combination of operational risk, capital risk, production risk, safety risk, and the like. Operational risk may include costs of operating in the hydrocarbon formation using the modeled network, such as costs due to people, other resources, regulations, and the like. Capital risk may be based on an investment amount in the subsurface operation and the modeled network, a chance to receive a target return (e.g., 5%, 10%, 15%, 20%, or more or less) based on the investment amount, and the like. Production risk may quantify an amount of waste or inefficiency (e.g., due to oversizing or undersizing the network and the like). Safety risk may include, for example, a risk of operating in the hydrocarbon formation using the modeled network, a risk based on a high pressure/high temperature operation, and the like.

In embodiments of the present disclosure, a variety of subsurface parameters (as incorporated in the multiple subsurface models 20) may be explored against many potential field development options (as incorporated in the network model 25) concurrently, by repeatedly connecting or coupling a subsurface model 20 to a network model 25 to determine how hydrocarbons may be transported from the hydrocarbon formation to a processing facility via the network at various points in time. The embodiments may also facilitate planning and/or evaluating cost of network equipment and systems by taking into account the effect of selected production methodology (e.g., artificial lift) and field layout on uncertain subsurface parameters.

In embodiments, an economic or costing model 40 may be received or generated that utilizes and processes output from the integrated model 30 to provide additional input to the same. The economic model 40 may include financial parameters (e.g., financial ranges or thresholds) that may be feasible or desired for operating the network or for extracting hydrocarbons. In some embodiments, the economic model 40 may include timing parameters, such as a build completion date of the network, a reservoir exhaustion date for the subsurface model 20, and the like. The economic model 40 may provide certain economic parameters such as cost of assets, daily operation costs, value of extracted hydrocarbons, and the like to evaluate the amount of hydrocarbons being produced. In some embodiments, when the economic model 40 is applied to the integrated model 30, scenarios or solutions included in the integrated model 30 that do not fit within the parameters of the economic model 40 (e.g., exceed a cost threshold, do not meet a production range, do not meet a deadline) may be excluded or disqualified.

The integrated model 30 or an output of the integrated model 30 (e.g., in the form of time-based production and/or economic results 50) may then be analyzed. In particular, the effects of the modeled network operating under the multiple sets 12 of input values and economic model 40 may be analyzed. The analysis may be performed within the integration model 30 and/or using reservoir simulation post-processing software for asset analysis and decision-making. For example, production rate, erosional velocity ratios (EVRs) in flowlines and/or risers, temperatures, and the like may be analyzed to determine if equipment in the modeled network should be adjusted. The post-processing software may facilitate loading results of the integrated model 30 output back to, for example, a Petrel platform for further analysis. The results may be based on a reservoir in conjunction with a network, rather than the hydrocarbon formation alone or the hydrocarbon formation and a network proxy. The results are therefore affected by changes to the network model 25, such as a back pressure from the network, effects of artificial lift, resizing of equipment, and the like. A more realistic result thus may be provided compared to a result obtained from the standalone reservoir run. In some embodiments, the illustrated workflow 10 may be configured to enable the user to see a subsurface model hydraulic response when exposed to back pressure input from the network model 25, and then through forward simulation, to investigate how the network model 25 will respond to the changing reservoir properties.

Determining suitable size and properties of the network equipment, such as flowline, pumps, separators, and the like, may depend upon fluid volume and other projected values of characteristics or parameters associated with hydrocarbons to be produced from the hydrocarbon formation. When the hydrocarbon formation parameter values are uncertain, the fluid volume and the other associated properties may also be uncertain. The methods of the present disclosure use multiple subsurface models 20 applied to one or more network models 25 over time in an integrated model 30 to identify expected ranges of production in the one or more networks over time and to identify when potential issues may arise (e.g., clog, low pressure) and/or facilitate design optimization (e.g., piping size, pump size), as discussed further below.

In some embodiments, the method of the present disclosure couples multiple subsurface models 20 with one or more network models 25 within an integrated model 30 (e.g., the IAM software), and then load the integrated model 30 results through time back into a platform (e.g., the Petrel software) for analysis. In particular, the effects of the modeled network operating under the multiple sets 12 of input values and economic model 40 may be analyzed. For example, production rate, EVRs in flowlines and/or risers, temperatures, and the like, may be analyzed to determine if equipment in the modeled network should be adjusted. In other embodiments, a separate program or workflow may be created to repeat the process between Petrel and PIPESIM or GAP software, for example.

Software may enable additional inputs to provide feedback to the integrated model 30 to realize more accurate results or generate a more robust integrated model 30. As illustrated, one or more sets 12 of input values, one or more subsurface models 20, one or more network model(s) 25, and/or the economic model(s) 40 may be changed 60 or updated based on the time-based production and/or the economic results 50. For example, additional input values associated with the hydrocarbon formation (e.g., a location of subsurface reservoir of hydrocarbons, locations of various geological formations, locations of various rock layers, locations of various types of deposits, and the like) may provide feedback to update the values of the multiple sets 12 of input values, the multiple subsurface models 20, and/or the economic model 40, and may be rerun using the workflow 10 (e.g., to generate a new integrated model 30).

In some circumstances using embodiments of the present disclosure, the integrated model 30 and/or separate studies may identify input parameters associated with the hydrocarbon formation and/or production network that may be particularly sensitive such that the corresponding results are near a threshold where the one or more network models 25 should be adjusted. For example, an analysis of the integrated model 30 outputs over time may indicate that an erosional velocity ratio (EVR) be above a respective threshold. As such, the analysis of the integrated model 30 outputs may indicate that flow lines should be resized. To determine an amount of size of the flow lines to increase, it may be desirable to feed new values of the permeability of the hydrocarbon formation at a certain period back to the multiple sets 12 of input values to realize the resulting impact. It may alternatively or additionally be desirable to feed resized flow lines to the network model 25 to realize the resulting impact, including the economic effect of increasing the size of the flow lines. In this manner, the workflow 10 of the present disclosure may assist the user in determining the most efficient solution for producing the hydrocarbon formation over various periods of time. Moreover, the sets 12 of input values, the network model 25, and/or the economic model 40, may be updated over time due to additional input provided by studies performed on the hydrocarbon formation, market factors (e.g., cost of material, cost of hydrocarbons being produced), and the like. As such, these updates may be fed back into the workflow 10.

In some embodiments, the analysis of the integrated model 30 or the output of the integrated model 30 (e.g., in the form of the time-based production and/or the economic results 50) may be automated and/or performed by software. In some embodiments, the automated analysis may include using a knowledge base, a best practices database (e.g., related to the assets of a network), or other data related to decision-making in the oil and gas exploration and production industry. The automated analysis may enable the integrated model 30 and/or additional inputs to feedback to the workflow 10. For example, the automated analysis may receive additional input and may, in some embodiments, automatically (e.g., without user input) feedback the additional input to the multiple sets 12 of input values, the multiple subsurface models 20, and/or the economic model 40, and rerun the workflow 10.

Using multiple subsurface models 20 in the disclosed embodiments increases understanding of the risks and uncertainties within the production system, confidence of network layouts, and increases granularity by effectively communicating the effects of different permutations of input values. The integrated model 30 and/or results of the integrated model 30 enables determining efficient equipment specifications that may be used in the network. In embodiments, information on selected and/or proposed equipment may be fed back into the workflow 10 to evaluate effectiveness and/or estimated production. For example, the time-based production results 50 of an integrated model 30 may identify a 25% chance of producing hydrogen sulfide ($H_2S$) from a hydrocarbon formation. It may then be desirable to adjust the network model 25 to include equipment to account for the H₂S production and rerun the workflow 10 to obtain an updated integrated model 30 that accounts for H₂S contaminants in the production fluid. In some embodiments, rerunning the workflow 10 to of the present disclosure address H₂S handling may be automated. As another example, the time-based production results 50 of an integrated model 30 may indicate that expected pressures at the hydrocarbon formation may be higher than the equipment may operate as originally included or specified in the network model 25. It may then be desirable to adjust the network model 25 to include equipment that is designed to operate in the identified pressure range to prolong the life of the equipment. Greater efficiency and cost savings may be realized using the workflow 10 of the present disclosure due to the ease of selecting and configuring well network equipment before the well network equipment is in place compared to the more expensive task of retrofitting well network equipment that is already in place. In addition, the well network equipment may also be modified in light of the analysis obtained using the workflow 10 of the present disclosure at a certain time before the pressure is expected to exceed the rating of the equipment.

Figure 2:
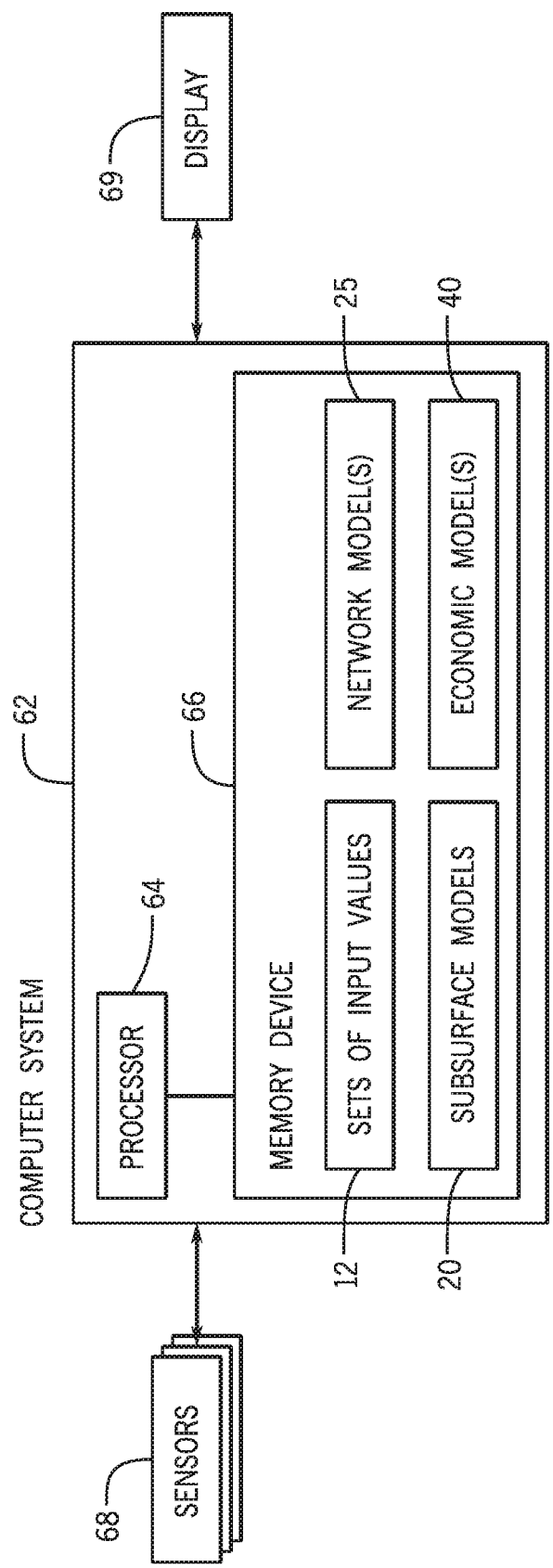
FIG. 2 is a block diagram of a computer system that couples multiple subsurface models of a hydrocarbon formation to one or more well network models to generate an integrated model, in accordance with an embodiment of the present disclosure.

In some embodiments, the disclosed methods (including the workflow 10) may be performed by a computer system. FIG. 2 is a block diagram of an example computer system 62 that applies multiple subsurface models 20 of a hydrocarbon formation to one or more network models 25, in accordance with embodiments of the present disclosure. The computer system 62 may be any suitable computing device, such as a desktop computer, a personal computer, a laptop device, a tablet, a mobile device, and the like. As illustrated, the computer system 62 includes a processor(s) 64 (e.g., a microprocessor(s)) that may execute software programs to perform the disclosed methods (including the workflow 10 and the method 70). Moreover, the processor 64 may include multiple microprocessors, one or more "general-purpose" microprocessors, one or more special-purpose microprocessors, and/or one or more application specific integrated circuits (ASICS), or some combination thereof. For example, the processor 64 may include one or more reduced instruction set (RISC) processors. The computer system 62 may include a memory device 66 that may store information such as control software, look up tables, configuration data, etc. The memory device 66 may store any combination of the sets 12 of input values, the multiple subsurface models 20, one or more economic models 40, and one or more network models 25. The memory device 66 may include a tangible, non-transitory, machine-readable medium, such as a volatile memory (e.g., a random access memory (RAM)) and/or a nonvolatile memory (e.g., a read-only memory (ROM)). The memory device 66 may store a variety of information and may be used for various purposes. For example, the memory device 66 may store machine-readable and/or processor-executable instructions (e.g., firmware or software) for the processor to execute, such as instructions for applying multiple subsurface models 20 of the hydrocarbon formation to one or more network models 25. The storage device(s) (e.g., nonvolatile storage) may include read-only memory (ROM), flash memory, a hard drive, or any other suitable optical, magnetic, or solid-state storage medium, or a combination thereof. The storage device(s) may store any suitable data and/or instructions.

In addition, the computer system 62 may be communicatively coupled to one or more sensors 68. The sensors 68 may include any suitable sensor, such as a pressure sensor, a temperature sensor, flow sensor, and the like. In certain embodiments, the sensors 68 may be disposed at the hydrocarbon formation or within the network to provide real-time data regarding the production and distribution of the extracted hydrocarbons. The data acquired by the sensors may be used to provide additional input for the integrated model 30 to provide more accurate results regarding the production of hydrocarbons and the distribution of hydrocarbons via the network.

The computer system 62 may also be communicatively coupled to a display 69. In some embodiments, the integrated model 30 or the time-based production and/or economic results 50 may be outputted to the display 69 for a user to analyze, review, or the like. The display 69 may be any suitable device that communicates the user, the integrated model 30 or the time-based production and/or economic results 50, such as a monitor, a liquid crystal display, and the like. In some embodiments, the display 69, such as a touchscreen, may provide input from the user.

Figure 3:
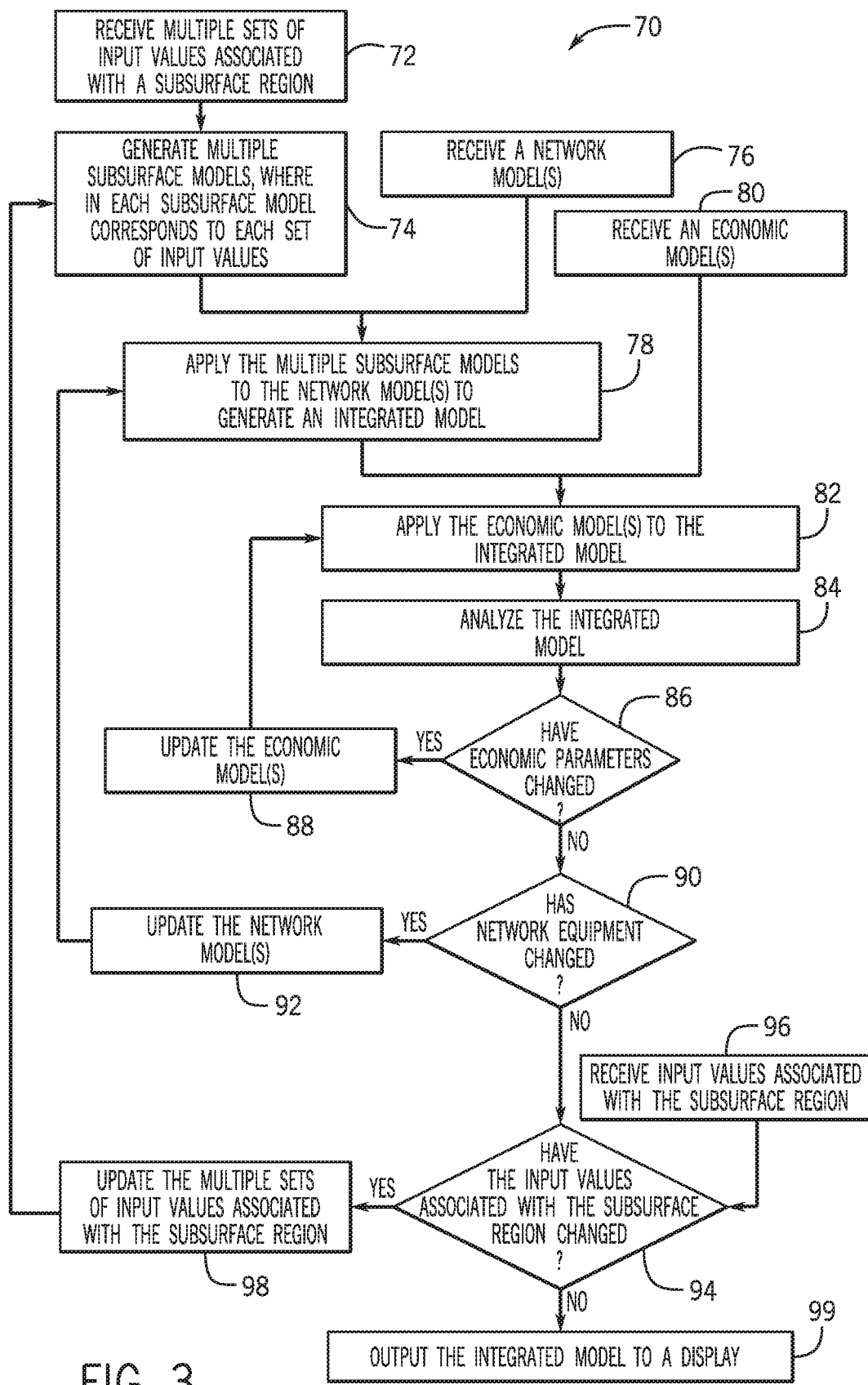
FIG. 3 is a flowchart of a method for applying multiple subsurface models of a hydrocarbon formation to one or more well network models to generate an integrated model, in accordance with an embodiment of the present disclosure.

FIG. 3 is a flowchart of a method 70 for applying the multiple subsurface models 20 of a hydrocarbon formation to one or more network models 25, in accordance with an embodiment of the present disclosure. In some embodiments, the processor 64 may perform the method 70 using software, including software that incorporates any combination of commercially available programs, such as ECLIPSE, Petrel, PIPESIM, GAP, IPM, IAM, and the like. Although the method 70 is described as being performed in a particular order, it should be noted that the method 70 may be performed in any suitable order.

The processor 64 may receive (block 72) multiple sets 12 of input values associate with a hydrocarbon formation or reservoir of the Earth. The multiple sets 12 of input values may relate any to input parameters useful for simulating the hydrocarbon formation, and may include gas content, oil content, water content, permeability, porosity, and the like. The processor 64 may then generate (block 74) multiple subsurface models 20, such that each subsurface model 20 corresponds to a set 12 of input values from block 72 and represents a production of the flow of hydrocarbons from the hydrocarbon formation. Each subsurface model 20 output may represent a version of the hydrocarbon formation, including the subsurface reservoir, and prediction controls, for example, oil, gas, and/or water production targets and constraints.

The processor 64 may receive (block 76) one or more network models 25 comprising one or more assets configured to distribute a flow of hydrocarbons from the hydrocarbon formation to a processing facility. Equipment and configuration of the network model(s) 25 may be selected (e.g., by a user, simulator, software, and the like) based on any combination of customer desire, availability, scheduling preferences, and the like. The equipment may include flowlines, risers, tubing, packers, valves, chokes, manifolds, separators, treatment equipment, metering devices, storage vessels, and the like.

The processor 64 may apply (block 78) the multiple subsurface models 20 to the network model(s) 25 to generate an integrated model 30, which may include outputs that provide multiple production rates of hydrocarbons via the assets over time. In some embodiments, the integrated model 30 outputs may include multiple scenarios that include the production rates of hydrocarbons that correspond to multiple sets of the assets over time. For example, each scenario may include a certain set of assets for a certain set of input values with the hydrocarbon formation, and a production rate of hydrocarbons corresponding to the scenario. The integrated model 30 outputs may provide reactions of the hydrocarbon formation to the network model(s) 25 (based on the multiple sets 12 of input values), and vice versa.

The processor 64 may also receive (block 80) one or more economic model(s) 40 that include desired financial and/or timing parameters. That is, the economic model 40 may detail any combination of a budget, deadline, revenue projection, cost projection, and the like. The processor 64 may apply (block 82) the economic model(s) 40 to the integrated model 30. As a result, scenarios or solutions included in the integrated model 30 that do not fit within the parameters of the economic model(s) 40 may be excluded or disqualified from outputs of the integrated model 30. In some embodiments, the results of applying the economic model(s) 40 to the integrated model 30 are incorporated to the integrated model 30. In alternative or additional embodiments, the results may be in the form of time-based production and/or economic results 50.

The processor 64 may then analyze (block 84) the integrated model 30 or the time-based production and/or economic results 50. In particular, the effects of the modeled network operating under the multiple sets 12 of input values and economic model 40 may be analyzed. For example, production rate, EVRs in flowlines and/or risers, temperatures, and the like may be analyzed to determine if equipment in the modeled network should be adjusted. The processor 64 may access a knowledge base, a best practices database, or other data (e.g., in the form of a database) related to decision-making in the oil and gas exploration and production industry. In some embodiments, an economic model 40 may not be applied to the integrated model 30, and analyzing the integrated model 30 analyzes the application of the multiple subsurface models 20 to the network model (s) 25.

Based on the analysis or additional information, the processor 64 may feed information back to the method 70. The processor 64 may determine (node 86) if economic parameters of the economic model(s) 40 have changed. If so, the processor 64 updates (block 88) the economic model(s) 40 based on the changed economic parameters and returns to block 82 to apply the updated economic model(s) 40 to the integrated model 30.

If the economic parameters of the economic model(s) 40 have not changed, the processor 64 may determine (node 90) if network equipment of the network model(s) 25 has changed. That is, the processor 64 may identify at least one of the assets of the network model(s) 25 to adjust based on the integrated model 30. If so, the processor 64 updates (block 92) the network model(s) 25 based on the changed network equipment and returns to block 78 to apply the multiple subsurface models 20 to the updated network model(s) 25.

If the network equipment of the network model(s) 25 has not changed, the processor 64 may determine (node 94) if the input values associated with the hydrocarbon formation have changed. The processor 64 may receive (block 96) the changed input values from the sensors 68 communicatively coupled to the computing system 62. If so, the processor 64 may update (block 98) the multiple sets 12 of input values associated with the hydrocarbon formation based on the changed input values and return to block 74 to generate the multiple subsurface models based on the updated sets 12 of input values. If the input values associated with the hydrocarbon formation have not changed, the processor 64 may output (block 99) the integrated model 30 to the display 69 coupled to the computer system 62. For example, the scenarios of the integrated model 30 may be outputted such that the user may review and/or analyze the network equipment of the integrated model 30 and effects of operating the network equipment. In some embodiments, the processor 64 may output a graphical user interface that includes a representation of the network equipment, in which the various assets may be selected, and the effects of operating the selected assets may be communicated.

Figure 4:
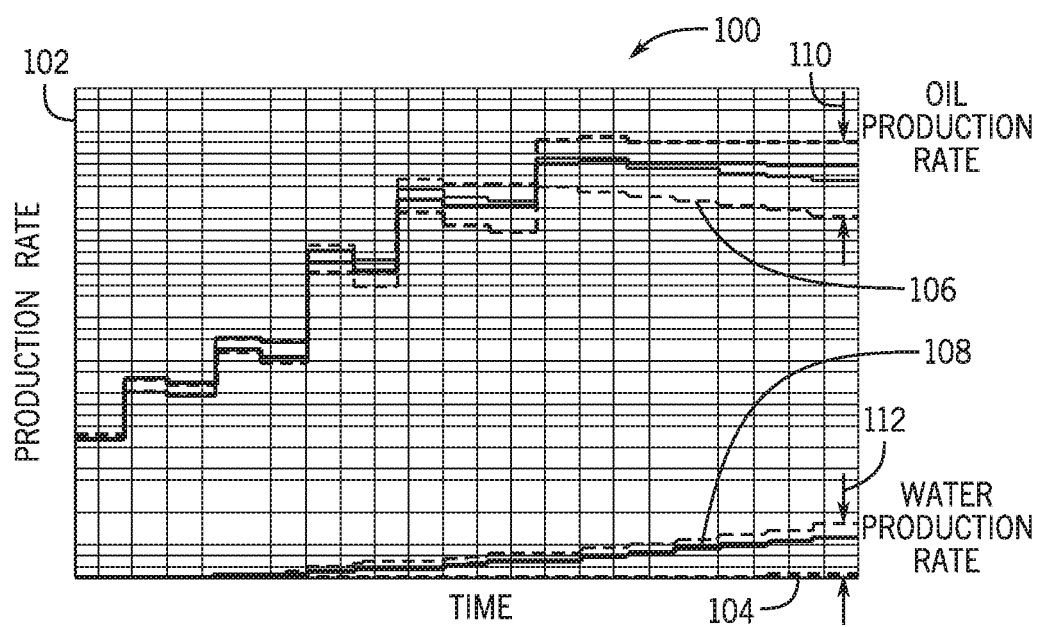
FIG. 4 is an example graph of production rates over time based on an integrated model, in accordance with an embodiment of the present disclosure.

In operation, the graphs of FIGS. 4-8 represent data analysis outputs (e.g., results 50) that may be provided based on one or more aspects of the present disclosure. FIG. 4 is a graph 100 of field production rates 102 over time 104 based on the integrated model 30 outputs, in accordance with an embodiment of the present disclosure. Each production rate (e.g., 106, 108) corresponds to a respective subsurface model 20 applied to a respective network model 25 in a respective integrated model 30 output. As illustrated, the spread of production rates (e.g., 110, 112) relate to a respective range of input values for the hydrocarbon formation parameters as applied to the respective network model 25. This range of relative production rates may be used, for example, to assess the risk of undersizing or oversizing facilities or equipment.

In certain embodiments, one or more wells corresponding to the network model 25 may be perforated in and produce fluid from a reservoir. Fluid hydrodynamics in the reservoir may be modeled in a reservoir simulator (e.g., the ECLIPSE software), and fluid movement in the one or more wells may be modeled in a network simulator (e.g., the PIPESIM software). An integrated model simulator (e.g., the IAM software) enables coupling these models (along with additional models) to model continuous fluid flow from the reservoir through the one or more wells to the surface. When the processor 64 receives data indicating that the spread of the production rates (e.g., 110, 112) is above a certain threshold, the processor 64 may send one or more commands to assets within the network to adjust certain operational parameters to increase the life of the assets, to increase the amount of production, to reduce a chance of water from breaking through and mixing with oil and/or gas, and the like. That is, the processor 64 may send commands to assets, such as pumps, compressors, artificial lifts, valves, injection machines, and the like to adjust their respective operations based on the results 50 (e.g., oil production rate at certain time, water production rate at certain time, spread of production rates).

Figure 5:
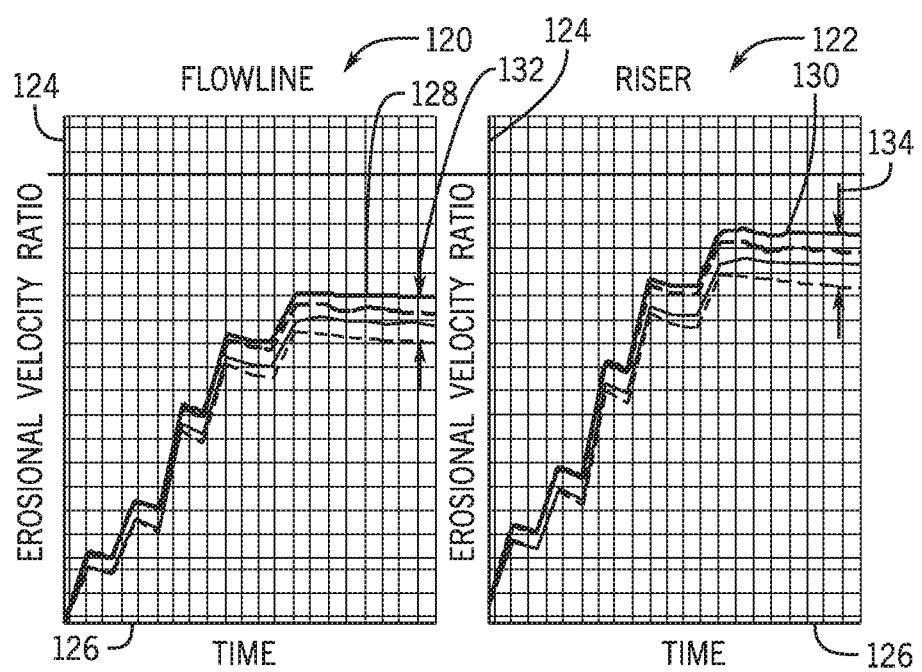
FIG. 5 includes example graphs of erosional velocity ratio (EVR) over time for flowlines and risers based on an integrated model, in accordance with an embodiment of the present disclosure.

One of the design parameters for flowlines and risers in the network may include erosional velocity ratio (EVR), where an EVR above 1 suggests erosion in a pipe or flowline may be occurring. FIG. 5 includes graphs 120, 122 of EVR 124 over time 126 for flowlines and risers based on the integrated model 30, in accordance with an embodiment of the present disclosure. The EVR value 124 may be tracked during a projected time period and the potential risk for erosion provided by the integrated model 30 may be illustrated and/or evaluated based on the spread (e.g., 132, 134) of the EVR curves (e.g., 128, 130). Using and integrating the multiple subsurface models 20 as illustrated in the graphs 120, 122, enables graphing the spread of the EVR curves. As such, the potential to exceed the threshold EVR ratio of 1 may be realized. As a result, the processor 64 may adjust the assets of the network model 25 to decrease production as a mitigation strategy to reduce the EVR value such that production may not exceed the EVR ratio threshold.

Figure 6:
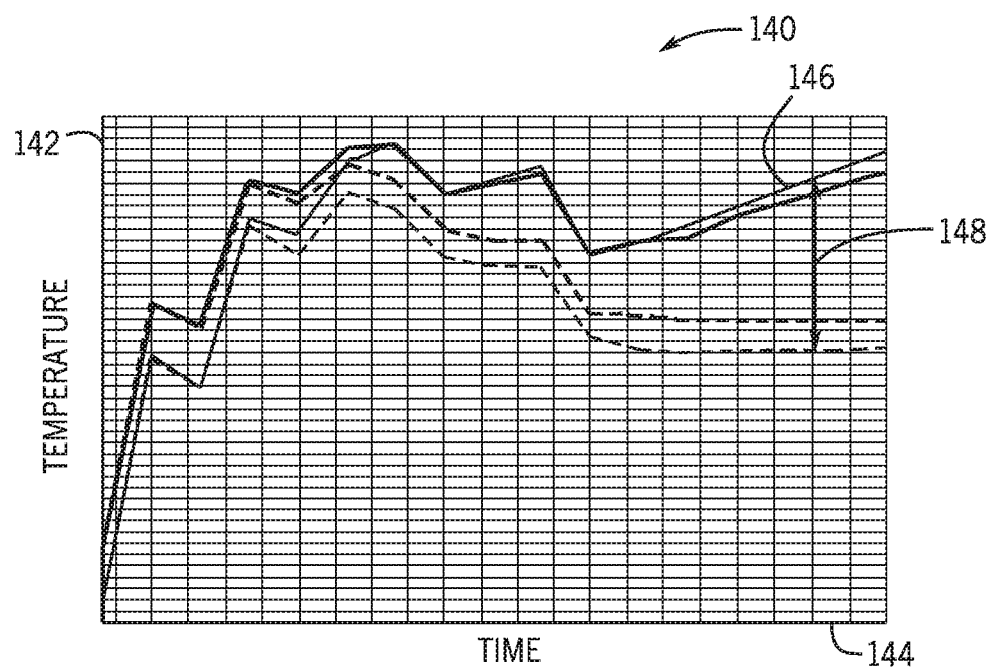
FIG. 6 is an example graph of riser base temperature over time based on an integrated model, in accordance with an embodiment of the present disclosure.

Flowlines may exhibit an undesired wax appearance when temperatures in sections of a network fall below a pour point of the fluid. FIG. 6 is a graph 140 of temperature 142 over time 144 based on the integrated model 30, in accordance with an embodiment of the present disclosure. Temperature changes (e.g., 146) may be tracked during a projected time period and a spread (e.g., 148) of the temperature changes associated with the produced fluids. Tracking the temperature changes and the temperature spread may enable determining a suitable start-up strategy for the network to ensure that the temperature stays above a specific temperature to prevent flow assurance issues. In this example, the graph 140 may reflect subsea boosting (e.g., energy to the fluid to reach the surface provided by a pump) that may maintain fluid temperatures in the flowline above the pour point of the fluid.

In certain embodiments, one or more wells corresponding to the network model 25 may be perforated in and produce fluid from a reservoir. As such, the processor 64 may send one or more commands to assets within the network to control the production and ensure that the temperature in portions of the network stays above the pour point of the fluid to avoid flow assurance issues. That is, the processor 64 may send commands to assets, such as pumps, compressors, artificial lifts, valves, injection machines, heating elements, and the like to adjust their respective fluid flow characteristics (e.g., temperature) to avoid the undesired wax appearance from building up in the assets.

Figure 7:
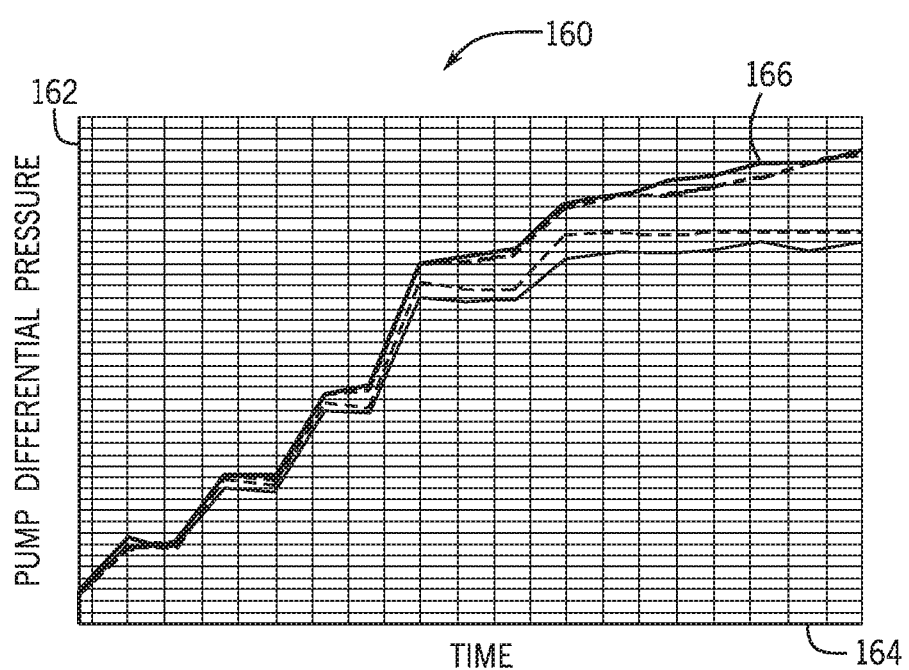
FIG. 7 is an example graph of pump differential pressure over time based on an integrated model, in accordance with an embodiment of the present disclosure.

FIG. 7 is a graph 160 of pump differential pressure 162 over time 164 based on the integrated model 30, in accordance with an embodiment of the present disclosure. Analysis of pump differential pressure (e.g., 166) as a function of time may be used to estimate pump efficiency during lifetime of the reservoir. In some embodiments, this analysis may determine when a single-phase pump is applicable and/or to forecast when the single-phase should be switched to a multiphase pump based on suction pressure and bubble point pressure of the fluid. As pumps are a long-lead item, it may be desirable to estimate time available for design and delivery of the pump. In certain embodiments, one or more wells corresponding to the network model 25 may be perforated in and produce fluid from a reservoir. As a result, the processor 64 may adjust operation of the assets of the network model 25 to use the single-phase pump or the multiphase pump based on the flowing conditions within the system.

Running multiple subsurface models 20 in conjunction with the network model 25 provides an opportunity to perform sensitivity studies regarding various input parameters. Such studies enable the user to investigate and resolve, for example, which input parameter is predicted to have a greater effect on production at a separator, which input parameter is predicted to have a greater effect on the sizing, layout, and artificial lift methods in the network model 25, and other like inquiries. Such predictions may be achieved by running the integrated model 30 with multiple subsurface models 20 as presently disclosed, as illustrated in the workflow 10 and the method 70. Thus, the methods of the present disclosure may be used to assess potential production risk based on certain field and/or equipment layout and reduce such risk through additional network appraisals and/or measurements. In some embodiments, the methods of the present disclosure enable network properties to be plotted in a tornado plot to perform sensitivity analysis.

FIG. 8 is a tornado plot 170 of an effect of permeability 172 and oil water contact level 174 on EVR 176 and oil production 178 based on the integrated model 30, in accordance with an embodiment of the present disclosure. The tornado plot 170 indicates that permeability 172 is a sensitive parameter as related to erosional velocity 176. As such, the processor 64 may adjust the sets 12 of input values associated with the hydrocarbon formation to include new values of permeability to realize a more accurate result or account for the sensitive nature of the permeability. Moreover, because erosional velocity 176 may have a significant effect on piping size, pump size design optimization, and/or flow line sizing, the processor 64 may adjust the assets of the network mode 25 to include varying these parameters to realize the resulting impact, including the economic effect of changing these parameters. The tornado plot 170 also indicates that oil water contact 174 is a sensitive parameter as related to oil production 178.

As such, the processor 64 may adjust the sets 12 of input values associated with the hydrocarbon formation to include new values of oil water contact to realize a more accurate result or account for the sensitive nature of the oil water contact on the oil production 178. Moreover, the processor 64 may adjust the economic model 40 based on the resulting oil production 178 realize the resulting impact, including the economic effect of a change in the oil production 178 due to adjusting the oil water contact 174. In this manner, the methods of the present disclosure may assist the user in determining the most efficient solution for producing the hydrocarbon formation. As such, the processor 64 may send one or more commands to assets within the network to adjust operation of the assets to avoid sensitive thresholds (e.g., relating to the EVR, the oil water contact, and the like).

In embodiments, the methods and systems of the present disclosure are used to investigate and generate data for analysis and determination of optimization-based decisions regarding a variety of operational aspects of production, including for example (and without limitation) decisions to adjust equipment size, change the selected equipment, change out the artificial lift method, gather observed limitations, and define possible controls. As the process of making decisions with regard to field operation is iterative, after new adjustments are made, the methods of the present disclosure may be repeated until a preferable configuration is identified or a risk is reduced to or below a defined acceptable level.

Early integration of the workflows of the present disclosure in the field development process can increase efficiency, extend mean time to failure of equipment and the reduction of failures. As presented schematically in FIGS. 1-8, in embodiments, the models can be used to identify potential production issues as they track the fluid composition and flow from the reservoir to the point of sale at any time during the simulation, and through such early identification of issues prevent costly future intervention and/or unexpected expenditures.

It should be noted that the integrated model 30 discussed above is generated based on the behavior of the subsurface model 20 in conjunction with the well network model 25. That is, the behavior of the subsurface model 20 affects how the production of hydrocarbons is distributed via the well network according to the well network model 25. In addition, how the production of hydrocarbons is distributed via the well network according to the well network model 25 affects the behavior of the subsurface model 20. As such, the combination of the two models 20 and 25 and assessing the effects of each model over time on the results of another model provides improvement in the field of hydrocarbon production and design to provide more efficient hydrocarbon production schemes and distribution schemes. Moreover, by using physical sensors to verify the outputs of each computer model, the presently disclosed systems and methods also provide improvements in the design and operation of hydrocarbon production and distribution technology based on the real-time data acquired regarding relevant information related to each respective model.

Reference throughout this specification to "one embodiment," "an embodiment," "embodiments," "some embodiments," "certain embodiments," or similar language means that a particular feature, structure, or characteristic described in connection with the embodiment may be included in at least one embodiment of the present disclosure. Thus, these phrases or similar language throughout this specification may, but do not necessarily, all refer to the same embodiment. Although the present disclosure has been described with respect to specific details, it is not intended that such details should be regarded as limitations on the scope of the present disclosure, except to the extent that they are included in the accompanying claims.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . ." or "step for [perform]ing [a function] . . .", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A method of integrated modeling using a plurality of subsurface models, comprising:
   receiving, via a processor, a plurality of sets of input values corresponding to one or more input parameters that are associated with a hydrocarbon formation of the Earth;
   receiving, via the processor, a network model configured to model one or more assets that distribute a flow of hydrocarbons from the hydrocarbon formation to a processing facility;
   generating, via the processor, the plurality of subsurface models based on the one or more input parameters and the plurality of sets of input values, wherein each subsurface model corresponds to the one or more input parameters and comprises a set of input values of the plurality of sets of input values, and wherein each subsurface model represents a production of the flow of hydrocarbons from the hydrocarbon formation;
   applying, via the processor, the plurality of subsurface models to the network model to generate an integrated model comprising a plurality of production rates of hydrocarbons via the one or more assets over time; and
   identifying, via the processor, at least one of the one or more assets to adjust based on the integrated model.

2. The method of claim 1, wherein the set of input values of the plurality of sets of input values comprises two or more of gas content, oil content, water content, permeability, porosity, oil-water contact, gas-oil contact, facies heterogeneity, and fault transmissivity.

3. The method of claim 1, wherein the network model corresponds to a single well, a network of wells, a production facility, production equipment, or any combination thereof, that is configured to transfer production of the flow of hydrocarbons from the hydrocarbon formation to a processing facility.

4. The method of claim 1, wherein each subsurface model is associated with:
   the hydrocarbon formation comprising a hydrocarbon reservoir; and
   a hydrocarbon production forecast as a function of time.

5. The method of claim 1, further comprising:
   analyzing, via the processor, the integrated model; and
   feeding, via the processor, information based at least in part on analyzing the integrated model back to generate another integrated model.

6. A system, comprising:
   a display;
   one or more sensors configured to provide real-time data regarding production and distribution of extracted hydrocarbons; and
   a computing system communicatively coupled to the one or more sensors and communicatively coupled to the display, wherein the computing system comprises a processor, wherein the processor is configured to:
      receive one or more network models, wherein each network model is configured to model one or more assets that distribute a flow of hydrocarbons from a hydrocarbon formation of the Earth to a processing facility;
      receive one or more economic models, wherein each economic model comprises a budget, deadline, revenue projection, cost projection, or any combination thereof;
      receive a plurality of sets of input values corresponding to one or more input parameters that are associated with the hydrocarbon formation;
      generate a plurality of subsurface models based on the one or more input parameters and the plurality of sets of input values, wherein each subsurface model corresponds to the one or more input parameters and to a set of input values of the plurality of sets of input values, and wherein each subsurface model represents a production of the flow of hydrocarbons from the hydrocarbon formation;
      apply the plurality of subsurface models to the one or more network models to generate an integrated model, wherein the integrated model comprises a plurality of scenarios, wherein each scenario comprises a production rate of hydrocarbons via the one or more assets over time;
      apply the one or more economic models to the integrated model, wherein the one or more economic models comprise one or more economic parameters, wherein applying the one or more economic models to the integrated model comprises removing at least one scenario of the plurality of scenarios of the integrated model when the at least one scenario does not correspond to the one or more economic parameters; and
      output the integrated model to the display, wherein outputting the integrated model comprises displaying the plurality of scenarios of the integrated model, such that the one or more assets and effects of operating the one or more assets are displayed.

7. The system of claim 6, wherein the processor is further configured to:

receive information associated with the hydrocarbon formation from the one or more sensors;

update at least one set of input values of the plurality of sets of input values based at least in part on receiving the information; and generate the plurality of subsurface models based on the at least one set of input values.

8. The system of claim 6, wherein the processor is further configured to:

receive information associated with the one or more economic models;

update the one or more economic models based at least in part on the information; and apply the updated economic model to the integrated model.

9. The system of claim 6, wherein the processor is further configured to:

receive information associated with the one or more network models;

update the one or more network models based at least in part on the information; and apply the plurality of subsurface models to the one or more updated network models to generate the integrated model.

10. The system of claim 6, wherein the plurality of sets of input values comprises two or more of gas content, oil content, water content, permeability, porosity, oil-water contacts, gas-oil contacts, facies heterogeneity, and any combination thereof.

11. The system of claim 6, wherein the one or more sensors comprise a pressure sensor, a temperature sensor, a flow sensor, or any combination thereof.

12. A tangible, non-transitory, machine-readable medium, comprising machine-readable instructions to cause a processor to:

receive a plurality of sets of input values corresponding to one or more input parameters that are associated with a hydrocarbon formation of the Earth;

receive a plurality of network models configured to model one or more assets that distribute a flow of hydrocarbons from the hydrocarbon formation to a processing facility;

generate a plurality of subsurface models based on the one or more input parameters and the plurality of sets of input values, wherein each subsurface model corresponds to the one or more input parameters and a set of input values of the plurality of sets of input values, and wherein each subsurface model represents a production of the flow of hydrocarbons from the hydrocarbon formation;

apply the plurality of subsurface models to the plurality of network models to generate an integrated model comprising a plurality of scenarios, wherein each scenario comprises a production rate of hydrocarbons via the one or more assets over time; and output the integrated model to a display, wherein outputting the integrated model comprises displaying the plurality of scenarios of the integrated model, such that the one or more assets and effects of operating the one or more assets are displayed.

13. The machine-readable medium of claim 12, further comprising machine-readable instructions to cause the processor to generate a second integrated model based on updating the plurality of sets of input values or the plurality of network models.

14. The machine-readable medium of claim 13, wherein generating the second integrated model comprises receiving information from a database related to the one or more assets of the plurality of network models.

15. The machine-readable medium of claim 13, wherein generating the second integrated model comprises adjusting at least one set of input values of the plurality of sets of input values based on proximity of the at least one set of input values to a threshold related to the one or more assets included in the plurality of network models.

16. The machine-readable medium of claim 12, further comprising machine-readable instructions to cause the processor to receive an economic model comprising a budget, deadline, revenue projection, cost projection, or any combination thereof associated with the production of the flow of hydrocarbons.

17. The machine-readable medium of claim 16, further comprising machine-readable instructions to:

receive information related to budget, deadline, revenue projection, cost projection, or any combination thereof; and adjust the economic model based at least in part on the information.

18. The method of claim 1, further comprising adjusting, via the processor, the at least one of the one or more assets based on the integrated model.

* * * * *